(12) United States Patent
Nowak

(10) Patent No.: US 8,492,823 B2
(45) Date of Patent: Jul. 23, 2013

(54) HIGH PERFORMANCE TAPERED VARACTOR

(75) Inventor: Edward J. Nowak, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 225 days.

(21) Appl. No.: 12/473,627

(22) Filed: May 28, 2009

(65) Prior Publication Data

US 2009/0239350 A1     Sep. 24, 2009

Related U.S. Application Data

(62) Division of application No. 11/276,369, filed on Feb. 27, 2006, now Pat. No. 7,560,798.

(51) Int. Cl.
| H01L 29/94 | (2006.01) |
| H01L 29/93 | (2006.01) |
| H01L 27/08 | (2006.01) |
| H01L 21/329 | (2006.01) |

(52) U.S. Cl.
USPC .......... 257/312; 257/480; 257/595; 257/596; 257/599; 257/600; 257/E29.344; 257/E27.049; 257/E21.364

(58) Field of Classification Search
USPC ................ 257/595, 596, 598, 599, 600, 312; 257/480, E29.344, E27.049, E21.364; 438/379
See application file for complete search history.

(56) References Cited

U.S. PATENT DOCUMENTS

| 2,989,671 | A * | 6/1961 | Mann et al. ................ 361/282 |
| 5,311,083 | A | 5/1994 | Wanlass |
| 5,644,167 | A | 7/1997 | Weiler et al. |
| 6,078,514 | A | 6/2000 | Takemae et al. |
| 6,265,920 | B1 | 7/2001 | Gauthier |
| 6,377,076 | B1 | 4/2002 | Gauthier |
| 6,413,802 | B1 | 7/2002 | Hu et al. |
| 6,521,939 | B1 | 2/2003 | Yeo et al. |
| 6,696,343 | B1 | 2/2004 | Chinthakindi et al. |
| 6,720,637 | B2 | 4/2004 | Voldman |
| 6,803,269 | B2 | 10/2004 | Coolbaugh et al. |
| 6,878,983 | B2 | 4/2005 | Coolbaugh et al. |
| 6,894,326 | B2 | 5/2005 | Nowak |
| 2002/0140107 | A1 | 10/2002 | Kato et al. |
| 2005/0179113 | A1 | 8/2005 | Kim et al. |

OTHER PUBLICATIONS

J.P. Kulkarni et al. "Process Technique for improving tuning range in MOS varactors", Proc. of IEEE INDICON Conference, Kharagpur, India, pp. 534-537 Dec. 2004.*

Kulkarni, Jaydeep et al., "Process Technique for Improving tuning Range in MOS Varactors", Proc. of IEEE INDICON Conference, Dec. 2004, pp. 534-537, Kharagpur, India.

* cited by examiner

*Primary Examiner* — Phat X Cao
*Assistant Examiner* — Diana C Vieira
(74) *Attorney, Agent, or Firm* — Scully, Scott, Murphy & Presser, P.C.; Richard M. Kotulak, Esq.

(57) ABSTRACT

Disclosed is a semiconductor structure, which includes a non-planar varactor having a geometrically designed depletion zone with a taper, as to provide improved Cmax/Cmin with low series resistance. Because of the taper, the narrowest portion of the depletion zone can be designed to be fully depleted, while the remainder of the depletion zone is only partially depleted. The fabrication of semiconductor structure may follow that of standard FinFET process, with a few additional or different steps. These additional or different steps may include formation of a doped trapezoidal (or triangular) shaped silicon mesa, growing/depositing a gate dielectric, forming a gate electrode over a portion of the mesa, and forming a highly doped contact region in the mesa where it is not covered by the gate electrode.

9 Claims, 7 Drawing Sheets

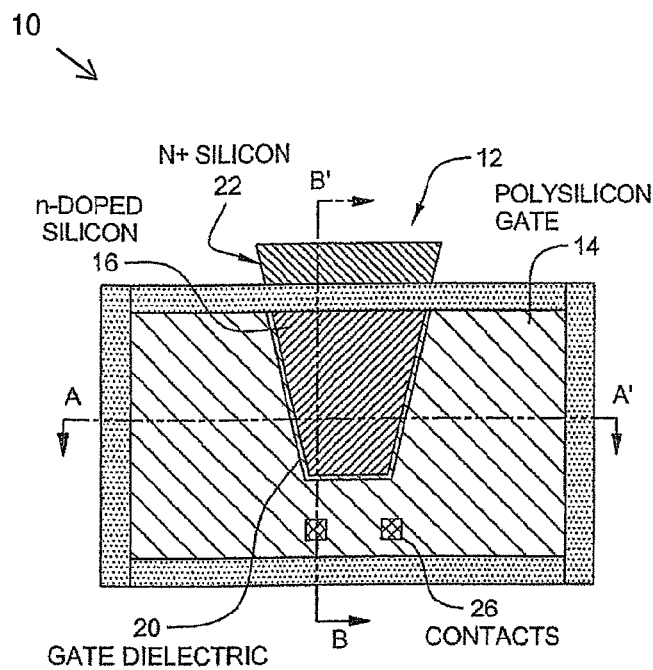
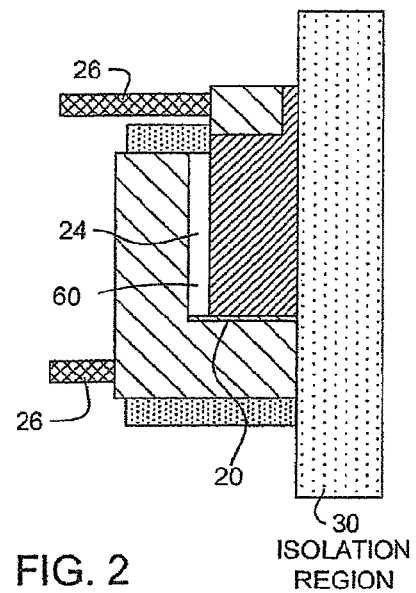
FIG. 1        FIG. 2
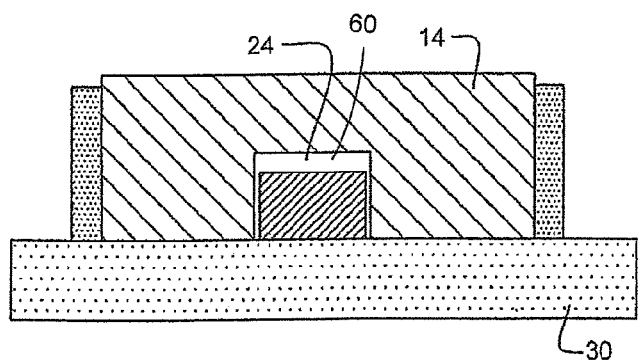
FIG. 3

HIGH PERFORMANCE TAPERED VARACTOR

CROSS REFERENCE TO RELATED APPLICATION

The present application is a divisional application of application Ser. No. 11/276,369, filed Feb. 27, 2006, now U.S. Pat. No. 7,560,798, issued Jul. 14, 2009.

BACKGROUND OF THE INVENTION

1. Field of the Invention

This invention generally relates to semiconductor devices and to methods of fabricating semiconductor devices. More specifically, the invention relates to the formation of a high performance varactor on silicon in the manufacture of integrated circuit devices.

2. Background Art

Varactors are voltage variable capacitors. These devices are essential for the design of key radio frequency (RF) CMOS and BiCMOS circuits, and are specifically used as tuning elements in voltage controlled oscillators (VCCs), phase shifters, phase-locked loop (PLL) circuits, and frequency multipliers.

In general, varactor designs must maximize a number of properties. One is "tunability," which is the ratio between the highest and lowest capacitive values (Cmax/Cmin) over the range of applied voltages for the circuit. Another is "linearity." There are two definitions of 'linearity': 1/sqrt(C) and d(LnC)/dV, where C is the voltage-dependent varactor capacitance. In the first case it is desired that 1/sqrt(C) be a straight line, and in the second, that d(LnC)/dV be a constant, both as V varies. Yet another property is "Q," or quality factor, which a function of the series resistance of the diode and the capacitive value of the varactor at the higher frequency ranges of the circuit.

In order to enhance the capacitive swing of a varactor, it also known to vary the dopant concentration of one or both of the diffused electrodes of the diode such that the diffusion has a retrograde dopant profile (that is, the dopant concentration is higher at the lower portion of the diffusion region than it is in the top). These so-called "hyperabrupt" junctions greatly increase the change in varactor capacitance for a given voltage swing.

In practice, it has proven to be difficult to simultaneously enhance tunability, linearity, and Q of a varactor when integrated into a CMOS or BiCMOS process. For example, considering the PFET source/drain junction and well as a varactor device, additional n-well implants will decrease the well resistance and increase varactor Q, but will decrease varactor tuning range by making the source/drain p-n junction depletion regions smaller.

Accordingly, a need has developed in the art for a varactor design that optimizes the tradeoffs between all of these properties, particularly when integrated into a process for forming other integrated circuit devices.

SUMMARY OF THE INVENTION

An object of this invention is to improve varactors in integrated circuit devices.

Another object of the present invention is to provide a varactor having improved Cmax/Cmin with low series resistance.

A further object of the invention is to use FinFET technology to provide a varactor having improved Cmax/Cmin and low series resistance.

These and other objectives are attained with a semiconductor structure, which includes a non-planar varactor having a geometrically designed depletion zone with a taper, as to provide improved Cmax/Cmin with low series resistance. Preferably, this depletion zone includes a narrower portion and a wider portion. Because of the taper, the narrowest portion of the depletion zone can be designed to be fully depleted, while the remainder of the depletion zone is only partially depleted. This results in low resistance to a contact at the end of the depletion zone. As the voltage of a gate of the varactor is moved further into depletion, the fully depleted portion of the depletion zone advances, decreasing the effective area of the capacitor.

The fabrication of the semiconductor structure may follow that of standard FinFET process, with a few additional or different steps. These additional or different steps may include formation of a doped trapezoidal (or triangular) shaped silicon mesa, growing/depositing a gate dielectric, forming a gate electrode over a portion of the mesa, and forming a highly doped contact region in the mesa where it is not covered by the gate electrode.

Further benefits and advantages of the invention will become apparent from a consideration of the following detailed description, given with reference to the accompanying drawings, which specify and show preferred embodiments of the invention.

BRIEF DESCRIPTION OF THE DRAWINGS

FIG. 1 is a top view showing a varactor embodying the present invention.

FIG. 2 is a side view taken along line A-A' of FIG. 1.

FIG. 3 is a side view taken along line B-B' of FIG. 1.

DETAILED DESCRIPTION OF THE PREFERRED EMBODIMENTS

Figure 4:
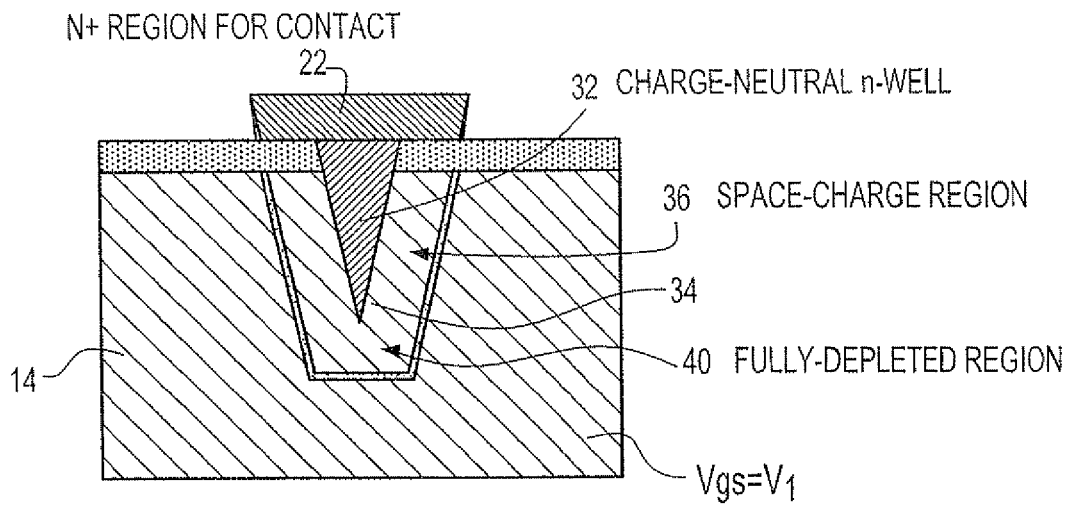
FIG. 4 shows a varactor embodying this invention and having a charge-neutral n-well of a given size.
Figure 5:
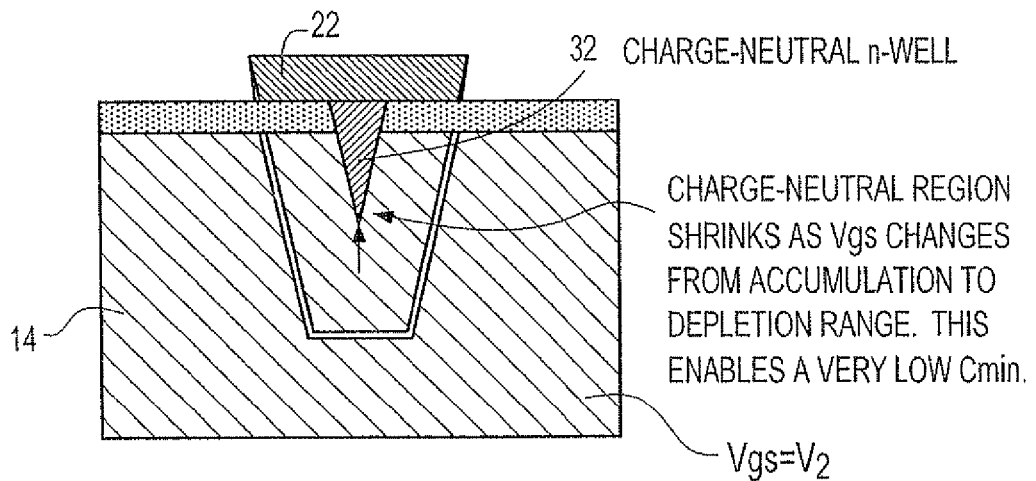
FIG. 5 shows the varactor of FIG. 4 with a smaller charge-neutral n-well.

FIGS. 1-5 illustrate semiconductor structure 10 including varactor 12. More specifically, structure 10 includes hardmask 60, mesa 16, gate dielectric 20, contact or contact region 22, gate electrode 14, contacts 26 and isolation region 30. With particular reference to FIGS. 4 and 5, mesa 16 includes charge neutral region 32 and depletion region 34, and this depletion region includes partially and fully depleted portions 36 and 40.

Figure 5A:
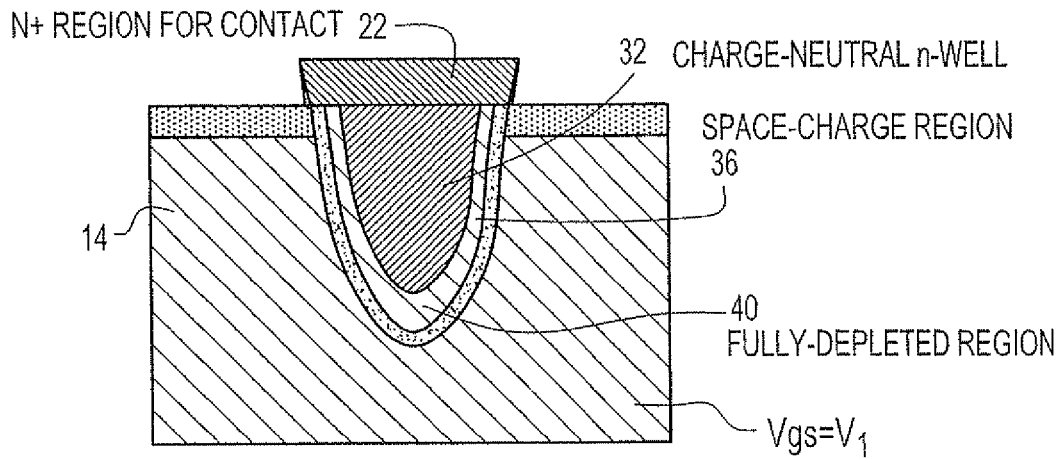
FIG. 5A shows a varactor embodying the present invention and with a curved surface.

As viewed in FIG. 1, mesa 16 has a downwardly inwardly tapered shape; and with the embodiment of the invention illustrated in FIGS. 1-5, the mesa has a trapezoidal cross-sectional shape. The mesa may have other shapes, though, such as a triangular shape, or other shapes. For instance, as shown in FIG. 5A, the mesa may have curved surfaces to enable customized capacitance vs. voltage behavior. Charge neutral region 32, with the embodiment of the invention shown in FIGS. 1-5, has a triangular cross-sectional shape; and, as viewed in FIG. 1, region 32 extends, downward from the top of the mesa 16, along a central axis thereof. Depletion region 34 is located outside of charge-neutral region 32 and fills the portion of the mesa 16 outside of that charge-neutral region.

Because of the taper of mesa 16, the narrowest region of the mesa can be fully depleted while the remainder of the mesa is only partially depleted. This results in low resistance to the contact 32 at the end of the mesa. As the voltage of the gate 14 is moved further into depletion, the depletion region 40 advances, decreasing the effective area of the capacitor as well as increasing the thickness of the space-charge region 36. With particular reference to FIGS. 4 and 5, as the voltage Vgs of polysilicon gate 14 changes from accumulation to depletion range, the size of charge-neutral region 32 shrinks.

The fabrication of structure 10, described in detail below, may follow that of standard FinFET process, with a few additional or different steps. These additional or different steps may include formation of a doped trapezoidal (or triangular) shaped silicon mesa 16, with hardmask 24 disposed above said mesa, growing/depositing a gate dielectric 20, forming a gate electrode 14 over a portion of the mesa, and forming a highly doped contact region 22 in the mesa where it is not covered by the gate electrode.

FIGS. 6-18 illustrate the fabrication of structure 10 in more detail.

Figure 6:
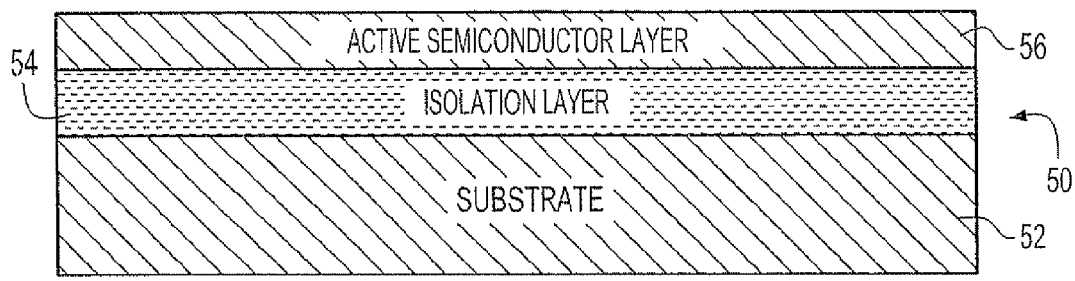
FIG. 6 illustrates a substrate structure that may be used in the fabrication of the varactor of FIGS. 1-5.

FIG. 6 shows a substrate 50 comprised of a bottom layer 52, an isolation layer 54 formed on top of the bottom layer, and an active semiconductor layer 56 formed on top of the isolation layer.

Preferably, substrate 50 is a silicon-on-insulator (SOI) substrate, wherein an upper layer of silicon is separated from the bulk substrate by a buried oxide layer (BOX). Alternatively, the isolation layer could be SiGe. Other types of substrates can be used, and, for instance, the substrate can be a bulk substrate made of single-crystal silicon, or could also be other semiconductor materials such as SiGe and a Group III-V semiconductor such as GaAs or InP. Moreover, the upper surface of the substrate could be doped with an atom that increases strain and hence mobility of minority carriers. For a silicon substrate, a Ge implant may be used to achieve this result.

Figure 7:
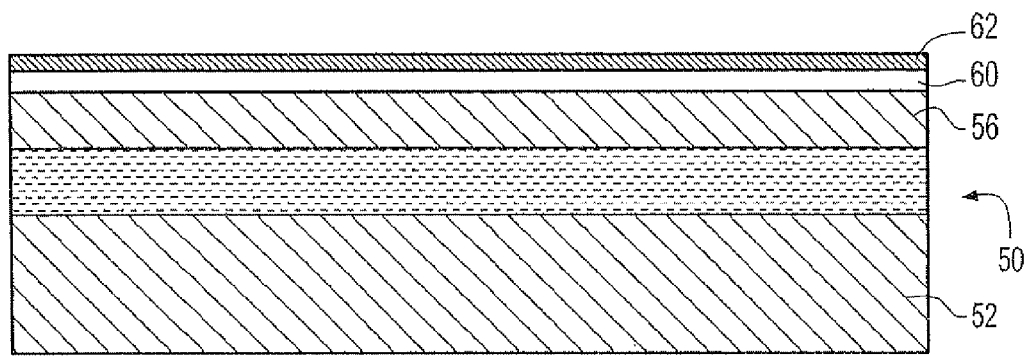
FIG. 7 depicts two hardmask films formed on the substrate of FIG. 6.

With reference to FIG. 7, hardmask films 60 and 62 are formed on substrate 50. For example, film 60 may be made by thermal oxidation of silicon to form SiO2, 5 nm to 40 nm thick. Film 62 may be Si3N4, 2 nm to 7 nm thick, and formed by a chemical vapor deposition (CVD) process. Other suitable materials, such as silicon oxynitride, and other suitable procedures may be used to form hardmask films 60 and 62. In an alternative embodiment, the films 60 and/or 62 may be formed at a greater thickness in regions were the inventive varactor is to be formed, than in regions where a FinFET is to be formed. This may be accomplished by ordinary means of masking and etching/depositing differing thicknesses of SiO2 and Si3N4 in the varactor and FinFET regions.

Figure 8:
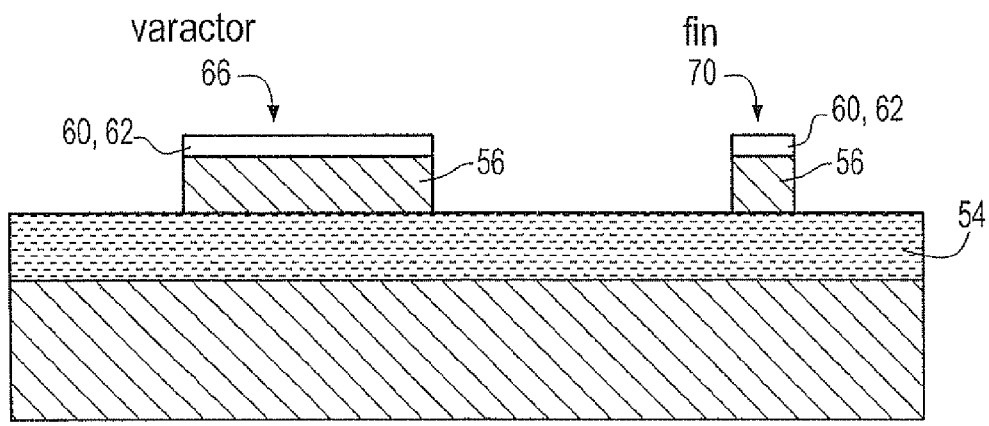
FIG. 8 shows a pattern etched into the structure depicted in FIG. 7.

With reference to FIG. 8, the next step in the fabrication process is to pattern and etch the hardmask films and active silicon 56, stopping the etch on isolation layer 54, and forming varactor pre-structure 66 and fin 70. Any suitable etching procedure may be used to etch the hardmask films and the silicon layer. As represented in FIG. 8, some, or all of the hardmask material may be etched away during, or after active semiconductor etching. Optionally, the hardmask may be selectively thinned, or removed, using a mask, opened on fin 70. This latter option may be used if a Tri-gate structure is to be formed from the fin.

Figure 9:
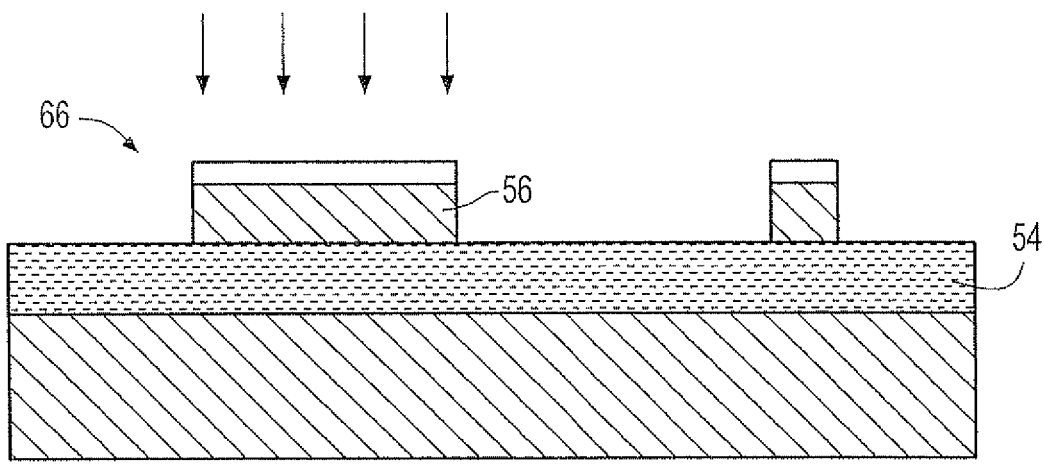
FIG. 9 illustrates a doping process that is used in the preferred procedure for fabricating the varactor of FIGS. 1-5.

As illustrated in FIG. 9, the varactor pre-structure 66 is then selectively doped with mask and ion implant. For example, As or P doping may be used to achieve between $10^{15}$ to $5 \times 10^{18}$ $cm^3$. Alternatively, the varactor pre-structure could be p-doped using, for example, Boron. The dopant can, for example, be at a dose of between approximately $10^{11}$ to $10^{14}$ atoms/$cm^2$ and at an energy between approximately 10-40 keV. In an alternate embodiment, this ion implant would be replaced or supplemented by ion implants with the same mask but tilted at angles so as to enter the exposed sidewalls of the varactor mesa 56. In this case, the energy of the implant may be chosen so as to avoid penetration of the hardmask 60 and provide further customization of the capacitance-voltage characteristic.

Figure 10:
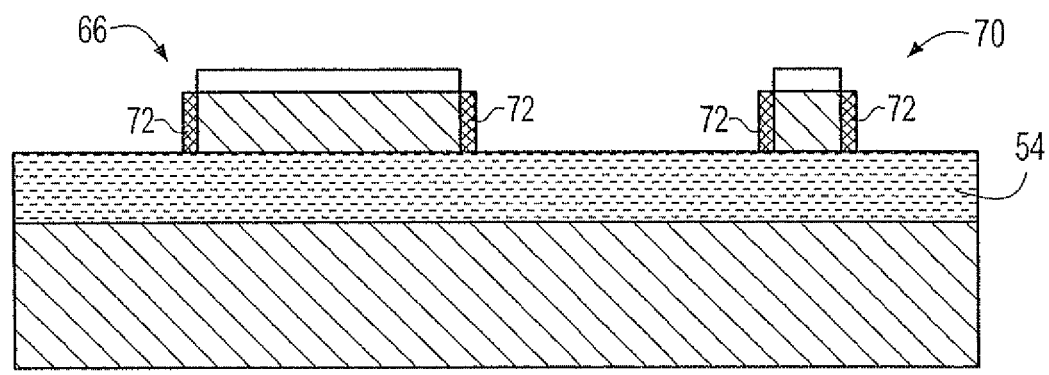
FIG. 10 represents the step of growing and then removing a sacrificial layer in the varactor fabrication process.

At this point, and with reference to FIG. 10, a sacrificial oxidation process may be used to repair any damage to surfaces of varactor pre-structure 66 and fin structure 70 during the etch process. If desired, oxidation may also be used to reduce the widths of structures 66 and 70, allowing desired dimensions to be achieved. For example, sacrificial layers 72 1-3 nm thick may be grown on structures 66 and 70. These layers may then be removed, for instance, via an isotropic etch (BHF/HF) to expose clean, smooth surfaces.

Figure 11:
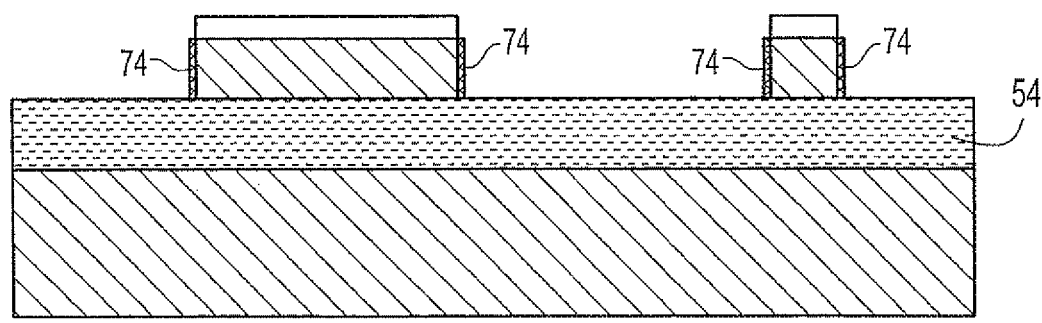
FIG. 11 shows the formation of a gate dielectric in the varactor fabrication process.

Next, as illustrated in FIG. 11, gate dielectrics 74 are grown or deposited on structures 66 and 70. These dielectrics 74 may be thermally grown silicon oxide or deposited silicon oxide, silicon oxynitride, or other high dielectric constant material that is suitable for use as a gate dielectric.

Figure 12:
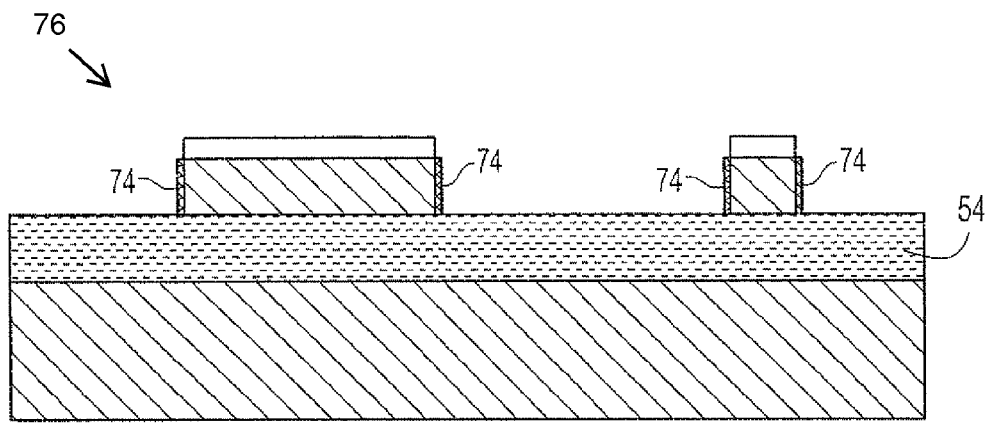
FIG. 12 depicts a gate electrode formed in the varactor fabrication process.

With reference to FIG. 12, as represented at 76, gate electrode is then formed over structures 66 and 70. Any suitable materials may be used to form the gates; and, for instance, the gate electrode may be doped polysilicon or other conductors such as tungsten, or metal silicide. Silicon germanium, a refractory metal or compounds such as titanium nitride or molybdenum may also be used. Also, optionally, the gate electrode may be planarized by a chemical-mechanical polish (CMP) or a reactive ion etch (RIE) back.

Figure 13:
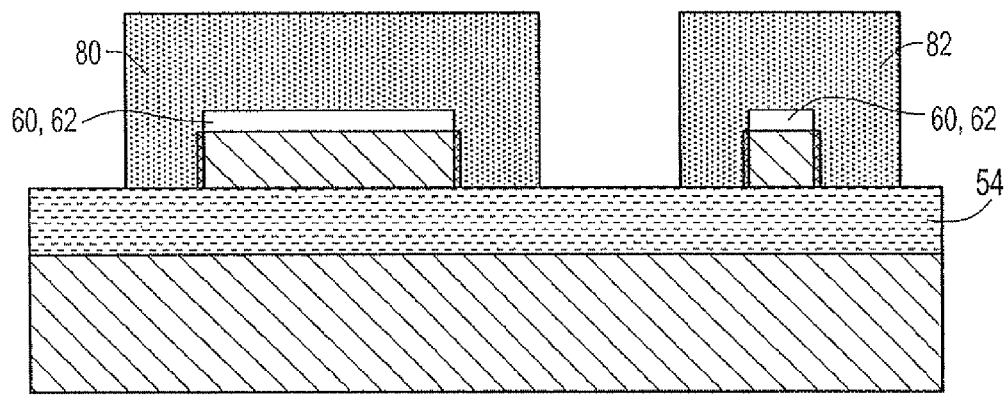
FIG. 13 shows the gate electrode of FIG. 12 after being patterned and etched.
Figure 14:
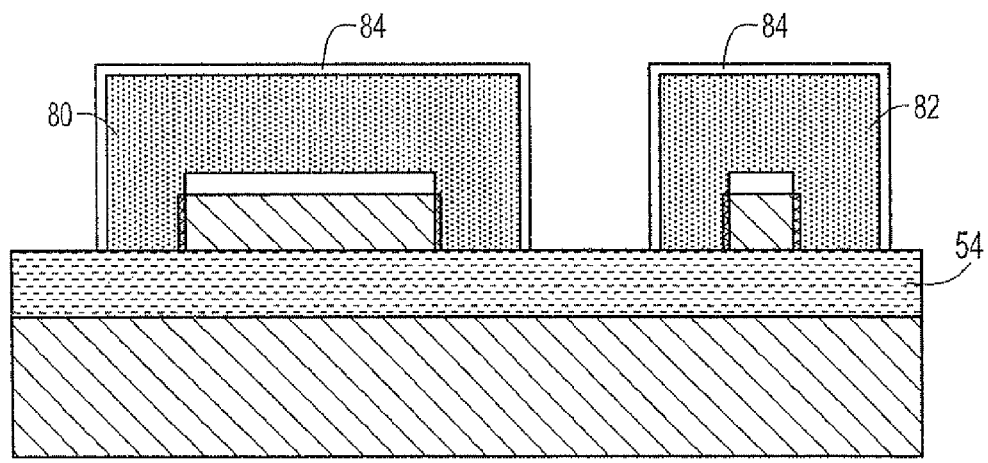
FIG. 14 illustrates a sidewall grown on the gate electrode.

With reference to FIG. 13, the next step in the fabrication is to pattern and etch the gate electrode 76, forming gates 80 and 82. To do this, a gate mask (not shown) is defined and then the underlying gate material 76 is etched to form gates 80 and 82, with the etching stopping on the gate oxide and the insulator layer 54. Gate 80 is electrically insulated from varactor structure 66 by the gate oxide and the hard mask overlying the varactor structure; and, likewise, gate 82 is electrically insulated from the fin structure 70 by the gate oxide and the hard mask. After formation of gates 80 and 82, the gate mask can be removed.

Next, as illustrated in FIG. 14, 1-3 nm layers 84 of SiO2 are grown on the sidewalls of gates 80 and 82 using an oxidation process. At this point, an ion implant of appropriate dopants may be used to form doped source and drain extensions and halos into FinFET. These ions may optionally also be implanted into exposed portions of varactor active silicon 66.

Figure 15:
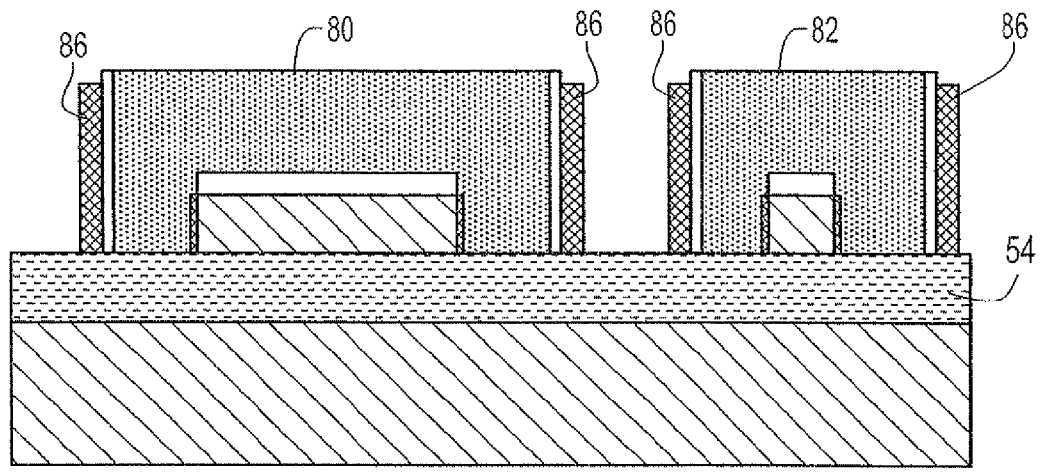
FIG. 15 shows spacers deposited on the gate electrodes depicted in FIG. 14.

The next step in the process, with reference to FIG. 15, is to form spacers 86 on the sidewalls of structures 66 and 70. This can be done by deposition and selective etching of a dielectric such as silicon nitride or silicon dioxide. This spacer etch may also be used to remove sidewall oxide that was on top of the gate electrodes, as shown in FIG. 15.

Figure 16:
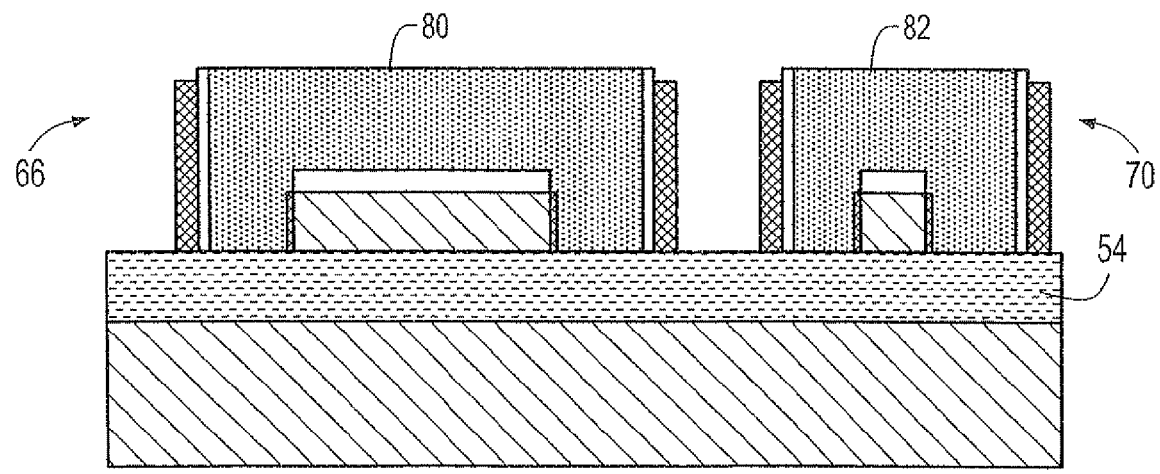
FIG. 16 illustrates an ion implantation step in the fabrication of the varactor of FIGS. 1-5.

After spacer formation, and with reference now to FIG. 16, doping of the source and drain regions of the FinFET 70 and of the varactor 66 is performed to make these regions electrically conductive. For example, N+ ion implant source/drain into exposed active semiconductor, for all n-type FinFETs and for the varactor. Alternatively, if the varactor body was doped p-type (Boron), then this ion implantation must be also p-type (and if the optional extension implant was performed after sidewall oxidation, that too must be p-type for the varactor). This p-type implant set could also be used in p-type FinFET source/drain regions.

Doping may be accomplished by ion implantation, gas immersion laser doping, ion shower doping, solid or gas source diffusion, or other conventional means. The dopant species is chosen to achieve the required device characteristics, either N-type or P-type, including dopant concentrations. Angled shallow ion implantation may be used to dope the sides and top of the source and drain regions without completely amorphizing them, as could result with a deeper vertical ion implant. Any implant damage or amorphization can be annealed through subsequent exposure to elevated temperatures.

Figure 17:
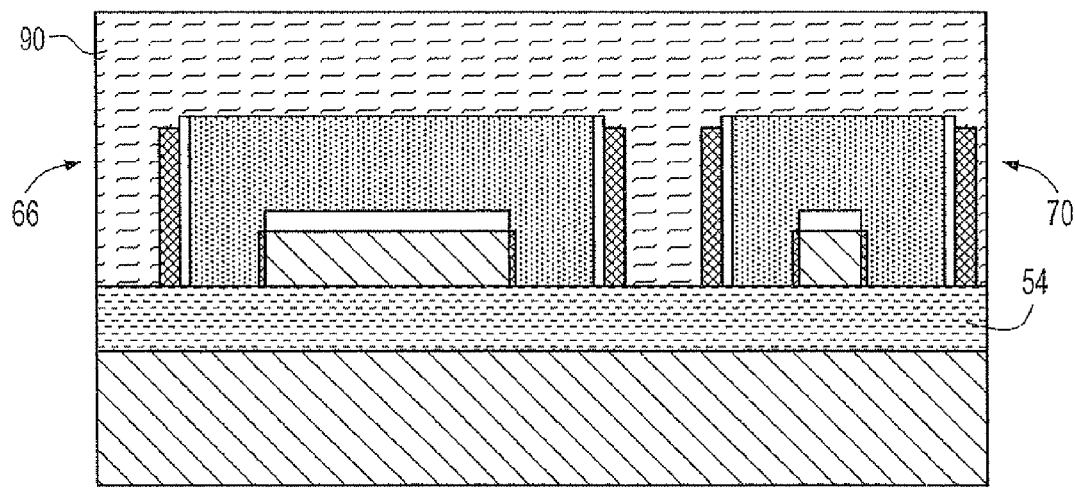
FIG. 17 depicts a dielectric formed on the structure of FIG. 16.

As illustrated in FIG. 17, dielectric 90 is formed. This dielectric, for example, may be silicon dioxide deposited by a CVD process. Other materials and other processes may be used, however, to form the dielectric.

Figure 18:
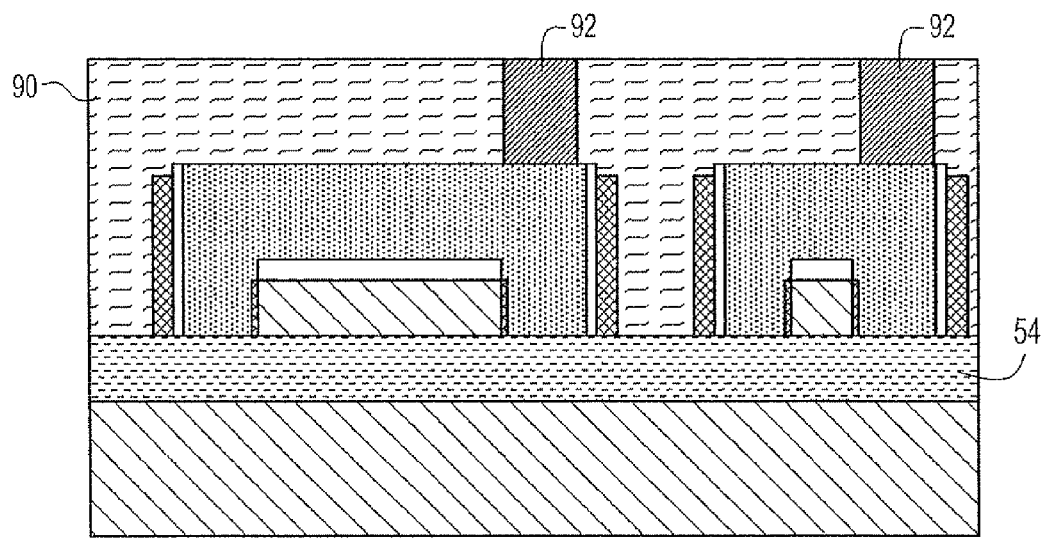
FIG. 18 shows contact vias formed in the dielectric of FIG. 17.

After dielectric 90 is formed, vias, shown at 92 in FIG. 18, are formed to contact gates and source/drain regions. Contacts 26 may then be provided, forming the varactor structure illustrated in FIGS. 1-5.

While it is apparent that the invention herein disclosed is well calculated to fulfill the objects stated above, it will be appreciated that numerous modifications and embodiments may be devised by those skilled in the art and it is intended that the appended claims cover all such modifications and embodiments as fall within the true spirit and scope of the present invention.

What is claimed is:

1. A method of fabricating a varactor in a semiconductor structure, comprising the steps of:
    providing a substrate; and
    forming a non-planar varactor on or above the substrate, including
    forming a mesa comprised of an active semiconductor material doped with a given ion implant and having a variable dopant concentration, the mesa having an inwardly sloping outside surface and including a variable size charge neutral region and a depletion region, said a depletion region including a narrower portion fully depleted of said ion implant, and a wider portion partially depleted of said ion implant; and
    providing the varactor with a contact region for applying a variable voltage to the varactor to change the size of the charge neutral region of the mesa;
    wherein the effective area of the varactor varies with the voltage applied to the varactor in a customized manner, and the varactor provides a predetermined capacitance vs. voltage behavior.

2. A method according to claim 1, wherein the charge neutral region of the mesa extends downward from a top of the mesa, along a central axis thereof, and said depletion region extends around said charge-neutral region.

3. A method according to claim 1, wherein said mesa has a trapezoidal shaped cross-section.

4. A method of fabricating a semiconductor structure, comprising the steps of:
    providing a substrate; and
    forming a non-planar varactor on or above the substrate, including
    forming a mesa having an inwardly sloping outside surface; and a depletion zone including a narrower, fully depleted portion, and a wider, partially depleted portion; and
    providing the varactor with a contact region for applying a variable voltage to the varactor; and, wherein
    the effective area of the varactor varies with the voltage applied to the varactor in a customized manner, and the varactor provides a predetermined capacitance vs. voltage behavior; and
    said mesa has a triangular shaped cross-section.

5. A method according to claim 1, wherein the forming step includes the steps of
    forming a gate material extending around said depletion region; and
    forming a gate dielectric material separating the depletion region from said gate material.

6. A method of customizing capacitance vs. voltage behavior of a varactor in a semiconductor structure, the method comprising the steps of:
    forming the varactor in the semiconductor structure; and
    providing the varactor with a mesa comprised of an active semiconductor material doped with a given ion implant and having a variable dopant concentration, the mesa having an outside surface having a predetermined curved shape and inwardly sloping along a defined axis, and including a variable size charge neutral region and an ion depletion zone having a variable dopant concentration of said ion implant;
    providing the varactor with a contact region for applying a variable voltage to the varactor; and
    applying a varying voltage to the varactor in a customized manner to charge change the size of the charge neutral region of the mesa to vary the effective area of the varactor to provide the varactor with a predetermined capacitance vs. voltage behavior.

7. A method according to claim 6, wherein the ion depletion zone defines an axis, and the providing step includes the step of curving said outside surface downwardly inwardly along said axis.

8. A method according to claim 7, wherein:
    the charge neutral region of the mesa extends downward from a top of the mesa, along a central axis thereof, and the ion depletion zone extends around said charge-neutral region and includes:
    a narrower, fully depleted portion; and
    a wider, only partially depleted portion; and
    the applying a varying voltage to the varactor includes applying the varying voltage to the varactor to advance the fully depleted portion of the depletion zone and to increase the thickness of the partially depleted portion of the depletion zone.

9. The method according to claim 2, wherein:

the depletion region fills the mesa outside of the charge-neutral region; and the method comprises the further steps of applying said variable voltage to the contact region and changing the voltage of the contact region from an accumulations to a depletion range to decrease the size of the charge-neutral region.

\* \* \* \* \*